US011303066B2

(12) United States Patent
Nakamura

(10) Patent No.: US 11,303,066 B2
(45) Date of Patent: Apr. 12, 2022

(54) CONNECTOR TRAY AND CONNECTOR

(71) Applicant: Japan Aviation Electronics Industry, Limited, Tokyo (JP)

(72) Inventor: Tomohiro Nakamura, Tokyo (JP)

(73) Assignee: JAPAN AVIATION ELECTRONICS INDUSTRY, LIMITED, Tokyo (JP)

( * ) Notice: Subject to any disclaimer, the term of this patent is extended or adjusted under 35 U.S.C. 154(b) by 0 days.

(21) Appl. No.: 16/850,359

(22) Filed: Apr. 16, 2020

(65) Prior Publication Data

US 2020/0343671 A1 Oct. 29, 2020

(30) Foreign Application Priority Data

Apr. 23, 2019 (JP) .............................. JP2019-081533

(51) Int. Cl.
*H01R 13/639* (2006.01)
*G06K 13/08* (2006.01)
*H05K 5/02* (2006.01)

(52) U.S. Cl.
CPC ....... *H01R 13/639* (2013.01); *G06K 13/0831* (2013.01); *H05K 5/0256* (2013.01)

(58) Field of Classification Search
CPC . H01R 13/639; H05K 5/0256; G06K 13/0831
USPC ......................................................... 439/159
See application file for complete search history.

(56) References Cited

U.S. PATENT DOCUMENTS

| | | | | |
|---|---|---|---|---|
| 2012/0276765 | A1* | 11/2012 | Nakase ................. | H04M 1/026 439/159 |
| 2014/0273646 | A1* | 9/2014 | Yun ....................... | H01R 12/714 439/629 |
| 2014/0342601 | A1* | 11/2014 | Matsunaga ............ | H01R 13/74 439/527 |
| 2015/0011118 | A1* | 1/2015 | Matsunaga ............ | H01R 13/22 439/527 |
| 2016/0248184 | A1* | 8/2016 | Motohashi ............. | G06K 13/08 |
| 2017/0351301 | A1* | 12/2017 | Takahashi ............. | G06F 1/1658 |
| 2018/0109032 | A1* | 4/2018 | Chen ................... | G06K 13/0856 |
| 2018/0332725 | A1* | 11/2018 | Orui ..................... | G06K 7/0043 |
| 2020/0343671 | A1* | 10/2020 | Nakamura ........... | G06K 7/0021 |

FOREIGN PATENT DOCUMENTS

| | | |
|---|---|---|
| CN | 207399192 U | 5/2018 |
| JP | 2014-225084 A | 12/2014 |
| JP | 2015-011954 A | 1/2015 |
| KR | 10-20070057559 A | 6/2007 |

OTHER PUBLICATIONS

Office Action dated Jan. 22, 2021 in Taiwan Application No. 109113135 (5 pages).

* cited by examiner

*Primary Examiner* — Alexander Gilman

(74) *Attorney, Agent, or Firm* — Muncy, Geissler, Olds & Lowe, P.C.

(57) ABSTRACT

A connector tray inserted into a connector body in an insertion direction while accommodating an object to be connected includes a tray body configured to accommodate the object to be connected, a tray exterior portion connected to the tray body to be displaceable along the insertion direction, and a push-push mechanism disposed between the tray body and the tray exterior portion in a tandem arrangement and configured to displace the tray exterior portion in the insertion direction between a first position away from the tray body and a second position close to the tray body.

5 Claims, 9 Drawing Sheets

CONNECTOR TRAY AND CONNECTOR

BACKGROUND OF THE INVENTION

The present invention relates to a connector tray inserted into a connector body while accommodating an object to be connected (hereinafter also called "connection object"), and a connector.

Conventionally, there have been known connection objects of card shape such as subscriber identity module (SIM) cards. As a connector for such connection objects, a connector of JP 2015-11954 A has been developed for example. As shown in FIG. 24, the connector of JP 2015-11954 A includes a card holder 1 for holding a plate-like connection object and a connector body 2 that is to be connected to the connection object held in the card holder 1 upon insertion of the card holder 1. The connector body 2 has therein a push-push mechanism 3 that is situated in parallel to the card holder 1 with respect to the insertion direction when the card holder 1 is inserted in the connector body 2. The push-push mechanism 3 is configured to push the card holder 1 out of the connector body 2 when the card holder 1 inserted in the connector body 2 is further pushed into the connector body 2 with a finger 4 of the user or another means. The connector body 2 is disposed inside a housing 5 of an electronic device for example, and when the card holder 1 is pushed out by the push-push mechanism 3, the card holder 1 is ejected from the housing 5.

In the connector of JP 2015-11954 A, however, when a contact force between the card holder 1 and the connector body 2 exceeds a force of the push-push mechanism 3 pushing out the card holder 1 for any reason, this may hamper the ejection of the card holder 1 from the housing 5 as also described in JP 2015-11954 A. Further, the card holder 1 is provided with a recess portion 6 as shown in FIG. 24, and when the card holder 1 is not ejected from the housing 5, it is necessary to hook a pin-shaped tool (not shown) on an edge of the recess portion 6 and forcibly pull out the card holder 1 from the connector body 2 using the pin-shaped tool.

SUMMARY OF THE INVENTION

The present invention has been made to solve the foregoing problems and aims at providing a connector tray and a connector that make it possible to smoothly take out a connection object from a connector body.

A connector tray according to the present invention is one inserted into a connector body in an insertion direction while accommodating an object to be connected, the connector tray comprising:

a tray body configured to accommodate the object to be connected;

a tray exterior portion connected to the tray body to be displaceable along the insertion direction; and a push-push mechanism disposed between the tray body and the tray exterior portion in a tandem arrangement and configured to displace the tray exterior portion in the insertion direction between a first position away from the tray body and a second position close to the tray body.

Since the push-push mechanism is configured to displace the tray exterior portion with respect to the tray body, even when the tray body is inserted in the connector body, the push-push mechanism can displace the tray exterior portion without being affected by a contact force between the tray body and the connector body.

A connector according to present invention is one in which the connector tray as described above is inserted in the connector body.

DETAILED DESCRIPTION OF THE INVENTION

An embodiment of the present invention is described below with reference to the accompanying drawings.

Figure 1:
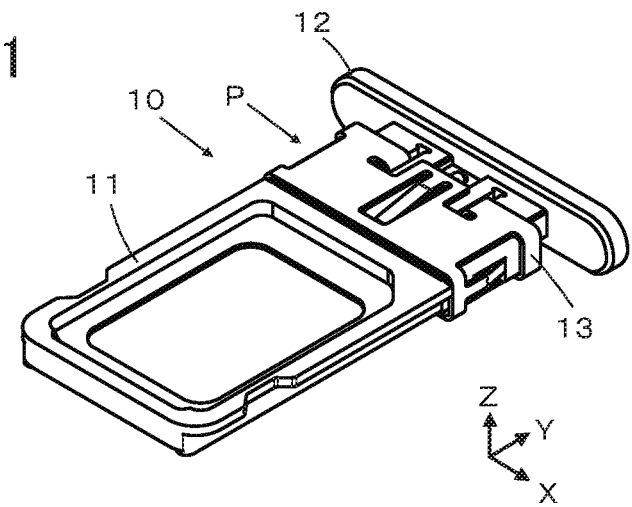
FIG. 1 is a perspective view of a connector tray according to Embodiment of the present invention.

FIG. 1 shows a connector tray 10 according to Embodiment. The connector tray 10 is configured to be inserted into a connector body (not shown) in an insertion direction while accommodating a connection object of card shape (not shown) such as a subscriber identity module (SIM) card. The connector tray 10 includes a tray body 11 for accommodating a connection object, a tray exterior portion 12 connected to the tray body 11 to be displaceable in the insertion direction, and a connection cover 13 joined with the tray body 11 and the tray exterior portion 12 and maintaining the connection between the tray body 11 and the tray exterior portion 12.

For convenience, assuming that the insertion direction of the connector tray 10 is a Y direction, the direction from the tray body 11 toward the tray exterior portion 12 is called "+Y direction," the width direction of the connector tray 10 perpendicular to the Y direction is called "X direction," and the height direction of the connector tray 10 perpendicular to the X direction and the Y direction is called "Z direction."

A push-push mechanism P is disposed between the tray body 11 and the tray exterior portion 12 in a tandem arrangement. The push-push mechanism P allows the tray exterior portion 12 to be displaceable in the Y direction between a first position away from the tray body 11 and a second position close to the tray body 11.

Figure 2:
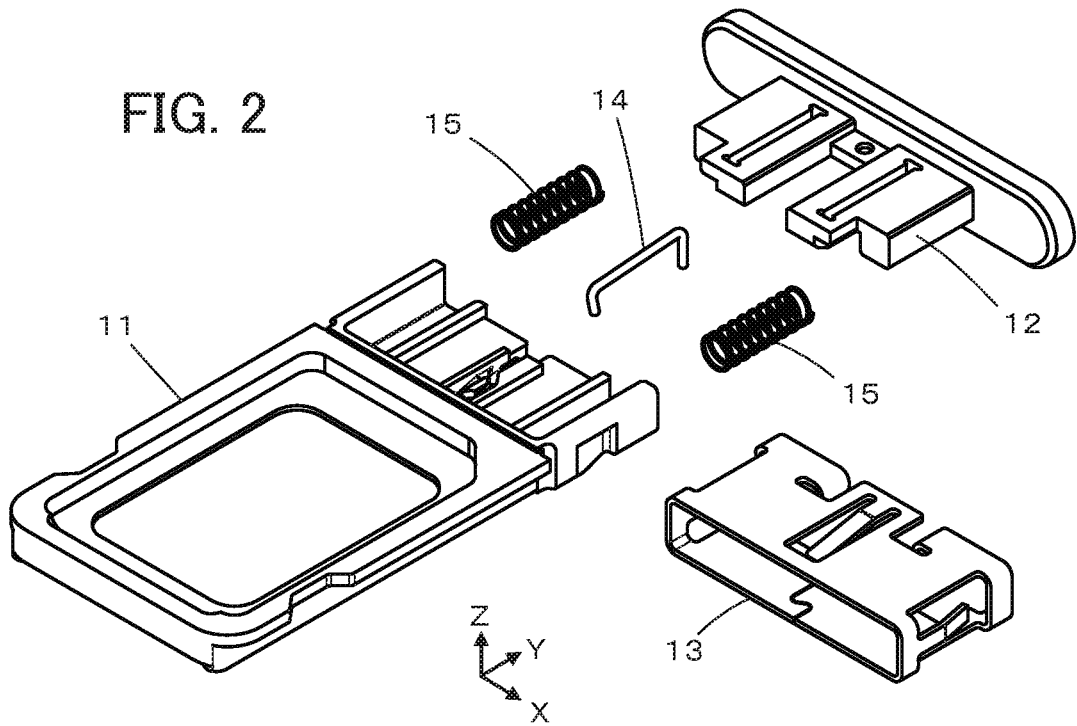
FIG. 2 is an exploded view of the connector tray according to Embodiment.

FIG. 2 shows an exploded view of the connector tray 10. In addition to the tray body 11, the tray exterior portion 12 and the connection cover 13 shown in FIG. 1, the connector tray 10 includes a cam follower 14 of rod shape connected to the tray body 11 and the tray exterior portion 12, and two springs 15 disposed on the tray body 11 on the opposite sides with respect to the cam follower 14 in the X direction. The tray body 11, the tray exterior portion 12, the cam follower 14 and the two springs 15 are assembled together, and the connection cover 13 is joined to the tray body 11 and the tray exterior portion 12, thus assembling the connector tray 10 shown in FIG. 1.

Figure 3:
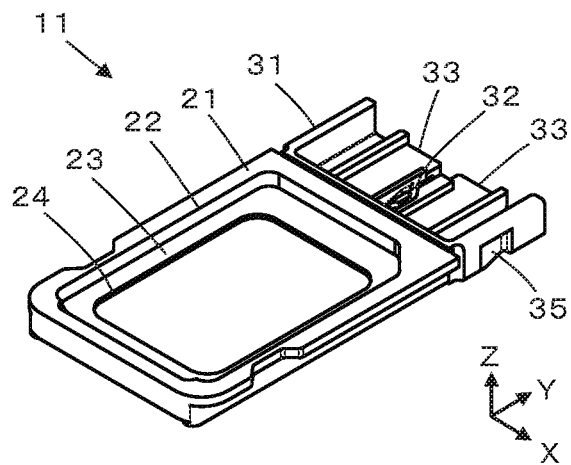
FIG. 3 is a perspective view of a tray body in Embodiment.

As shown in FIG. 3, the tray body 11 has a substantially rectangular shape with a pair of long sides extending along the Y direction, and includes a connection object accommodating portion 21 that is situated on the −Y direction side and provided to accommodate a connection object (not shown) and a tray body-side connection portion 31 that is situated on the +Y direction side and is to be connected to the tray exterior portion 12.

The connection object accommodating portion 21 has a substantially rectangular shape with a pair of long sides extending along the Y direction when viewed in the Z direction. The connection object accommodating portion 21 is provided with an accommodating recess portion 22 which opens in the +Z direction and in which a connection object is to be accommodated. The accommodating recess portion 22 has a substantially rectangular shape with a pair of long sides extending along the Y direction, and is provided at its bottom 23 with an opening 24 having a substantially rectangular shape with a pair of long sides extending along the Y direction. Although not illustrated, for instance, when a connection object of card shape is accommodated in the accommodating recess portion 22 with a connection terminal of the connection object facing in the −Z direction, the connection terminal of the connection object is exposed in the −Z direction through the opening 24 of the accommodating recess portion 22, so that the connection terminal of the connection object can be connected to a connector body (not shown) through the opening 24.

The tray body-side connection portion 31 has a substantially rectangular shape with a pair of long sides extending along the X direction when viewed in the Z direction. The tray body-side connection portion 31 is provided with a cam groove 32 that is situated in the middle of the tray body-side connection portion 31 in the X direction and a pair of guide portions 33 that are situated separately on the opposite sides with respect to the cam groove 32 in the X direction and extend in the Y direction.

The tray body-side connection portion 31 is further provided on its opposite sides in the X direction with, separately, connection cover attachment recess portions 35 for attaching the connection cover 13.

Figure 4:
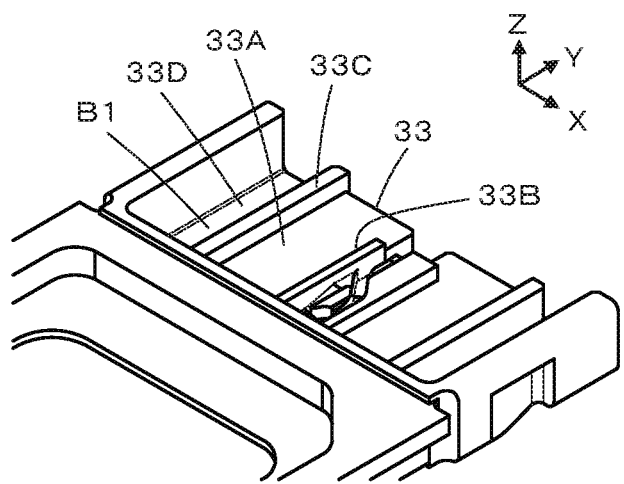
FIG. 4 is an enlarged perspective view of a tray body-side connection portion in Embodiment.
Figure 5:
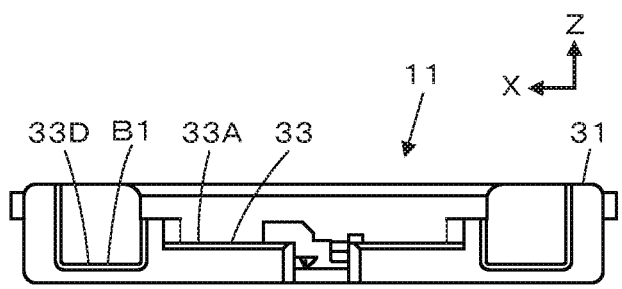
FIG. 5 is a front view of the tray body in Embodiment.

As shown in FIG. 4, the pair of guide portions 33 are closed at their −Y directional ends and open in the +Y direction and the +Z direction, and are symmetrical with respect to a YZ plane. The pair of guide portions 33 have flat guide bottoms 33A that extend along an XY plane, an inner guide wall 33B that is situated in an inner position in the X direction within the tray body-side connection portion 31 and extends in the Y direction while projecting in the +Z direction, and outer guide walls 33C that are situated in outer positions in the X direction within the tray body-side connection portion 31 and extend in the Y direction while projecting in the +Z direction. The pair of guide portions 33 also have spring receiving grooves 33D for receiving the springs 15, the spring receiving grooves 33D being situated on the outer sides of the outer guide walls 33C in the X direction within the tray body-side connection portion 31 and extending in the Y direction. The spring receiving groove 33D is provided at its bottom with a spring receiving groove bottom B1 of flat shape extending along an XY plane. As shown in FIG. 5, the spring receiving groove bottom B1 of the spring receiving groove 33D is formed at a position lower than the guide bottom 33A, i.e., on the −Z direction side of the guide bottom 33A in order to allow the spring receiving groove 33D to stably receive the spring 15.

Figure 6:
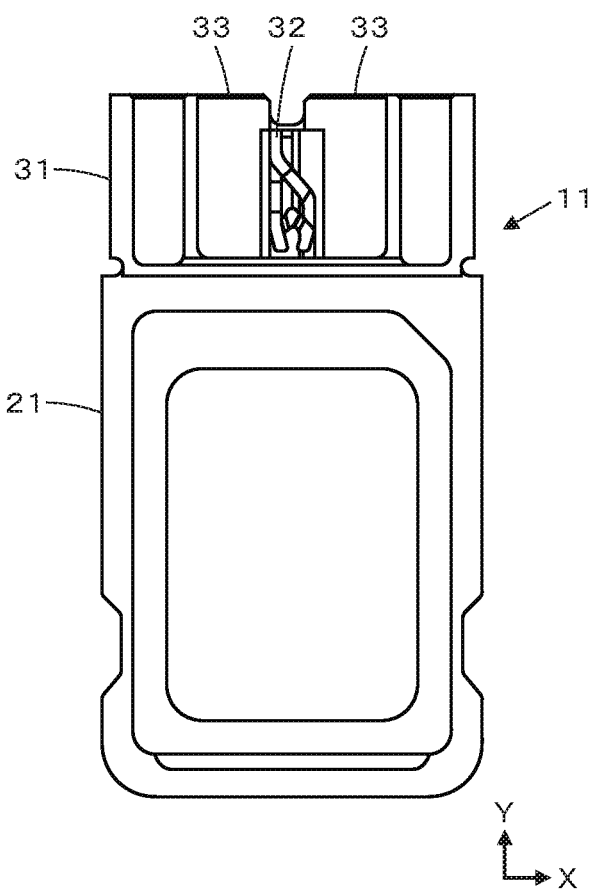
FIG. 6 is a plan view of the tray body in Embodiment.
Figure 7:
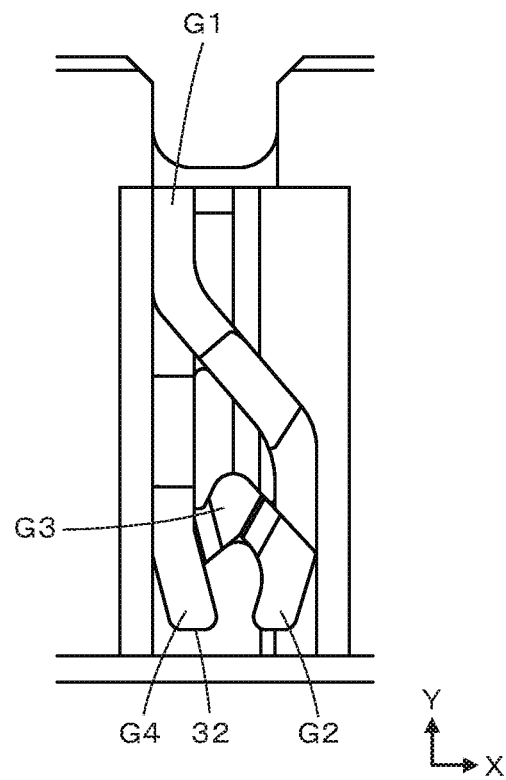
FIG. 7 is an enlarged view of a cam groove formed in the tray body in Embodiment.

As shown in FIG. 6, the cam groove 32 is formed in the middle of the tray body-side connection portion 31 in the X direction to receive the −Y directional end of the cam follower 14. As shown in FIG. 7, the cam groove 32 has a so-called heart shape that is closed, and has a point G1 corresponding to the +Y directional end of the cam groove 32, a point G2 corresponding to the −Y directional end of the cam groove 32, a point G3 situated on the −X direction side of the point G2 and between the points G1 and G2 in the Y direction, and a point G4 situated on the −X direction side of the point G3 and corresponding to the −Y directional end of the cam groove 32 together with the point G2.

The cam groove 32 is provided with a plurality of steps so as to allow the −Y directional end of the cam follower 14 (not shown) to move not counterclockwise but only clockwise along the cam groove 32 when the cam groove 32 is viewed from the +Z direction side.

Figure 8:
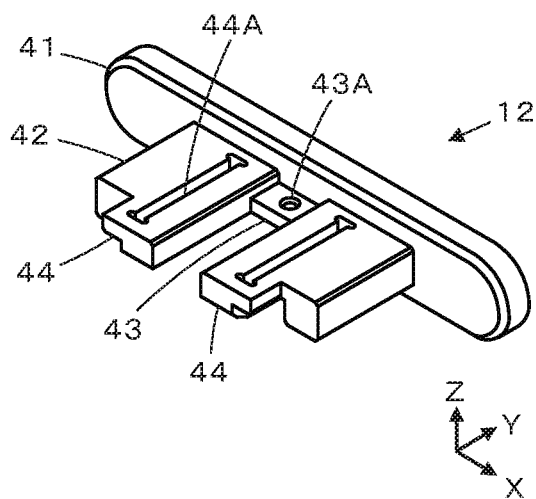
FIG. 8 is a perspective view of a tray exterior portion in Embodiment.

As shown in FIG. 8, the tray exterior portion 12 includes a grip portion 41 of plate shape that extends in the X direction and a tray exterior portion-side connection portion 42 that projects in the −Y direction from the grip portion 41 and is to be connected to the tray body 11 (not shown).

The tray exterior portion-side connection portion 42 includes a cam follower joint portion 43 that is situated in the middle of the grip portion 41 in the X direction and is to be joined with the +Y directional end of the cam follower 14 (not shown) and a pair of guided portions 44 that is situated on the opposite sides with respect to the cam follower joint portion 43 in the X direction and is to make contact with the pair of guide portions 33 of the tray body-side connection portion 31 (not shown).

The cam follower joint portion 43 is provided with a cam follower insertion hole 43A penetrating the cam follower joint portion 43 in the Z direction.

Figure 9:
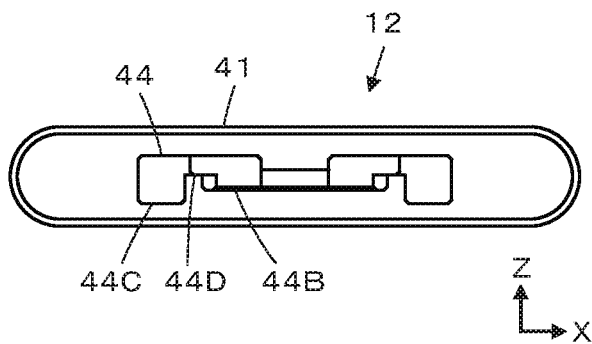
FIG. 9 is a back view of the tray exterior portion in Embodiment.
Figure 10:
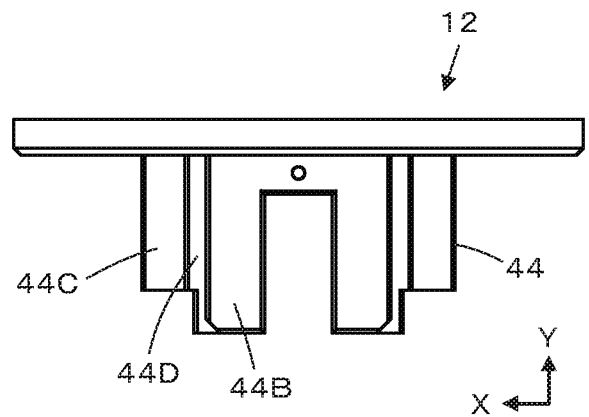
FIG. 10 is a bottom view of the tray exterior portion in Embodiment.

The pair of guided portions 44 are provided in their upper portions on the +Z direction side with connection cover attachment grooves 44A extending along the Y direction for attaching the connection cover 13 (not shown). As shown in FIG. 9, the pair of guided portions 44 are provided with guided inner protrusions 44B that are situated in inner positions in the X direction within the tray exterior portion-side connection portion 42 and protrude in the −Z direction, guided outer protrusions 44C that are situated in outer positions in the X direction within the tray exterior portion-side connection portion 42 and protrude in the −Z direction, and guided recess portions 44D each situated between the guided inner protrusion 44B and the guided outer protrusion 44C. The guided outer protrusion 44C is larger in height in the Z direction than the guided inner protrusion 44B. As shown in FIG. 10, the guided inner protrusions 44B, the guided outer protrusions 44C and the guided recess portions 44D all extend in the Y direction.

Figure 11:
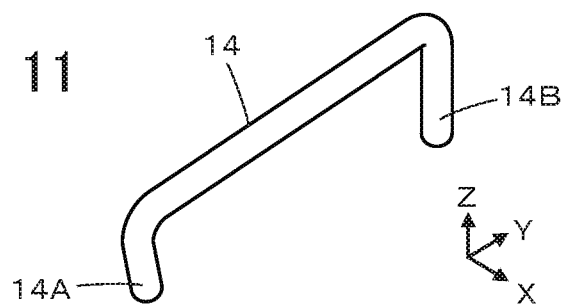
FIG. 11 is a perspective view of a cam follower in Embodiment.

As shown in FIG. 11, the cam follower 14 is an elongated cylindrical member extending in the Y direction and is provided at its one end, that is, its −Y directional end, with a first bending portion 14A bending in the −Z direction and at its other end, that is, its +Y directional end, with a second bending portion 14B bending in the −Z direction.

Figure 12:
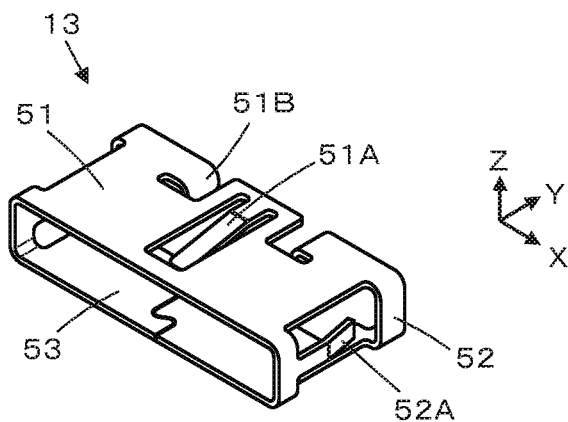
FIG. 12 is a perspective view of a connection cover in Embodiment.

As shown in FIG. 12, the connection cover 13 is constituted of a connection cover upper wall 51 that extends along an XY plane, a pair of connection cover lateral walls 52 that are connected to the connection cover upper wall 51 and extend along a YZ plane, and a connection cover lower wall 53 that is connected to the connection cover lateral walls 52 and extends along an XY plane on the −Z direction side of the connection cover upper wall 51. The connection cover 13 has a tubular shape opening in the +Y direction and the −Y direction. The connection cover upper wall 51 is provided in its middle in the X direction with an upper wall plate spring 51A that extends in the −Y direction from the +Y directional end of the connection cover upper wall 51 and is inclined in the −Z direction. The connection cover upper wall 51 is also provided at its +Y directional end with a pair of upper wall bending portions 51B bending in the −Z direction. The connection cover lateral walls 52 are separately provided with lateral wall plate springs 52A that extend in the +Y direction from the −Y directional ends of the connection cover lateral walls 52 and are inclined toward the inside of the connection cover 13 in the X direction.

Figure 13:
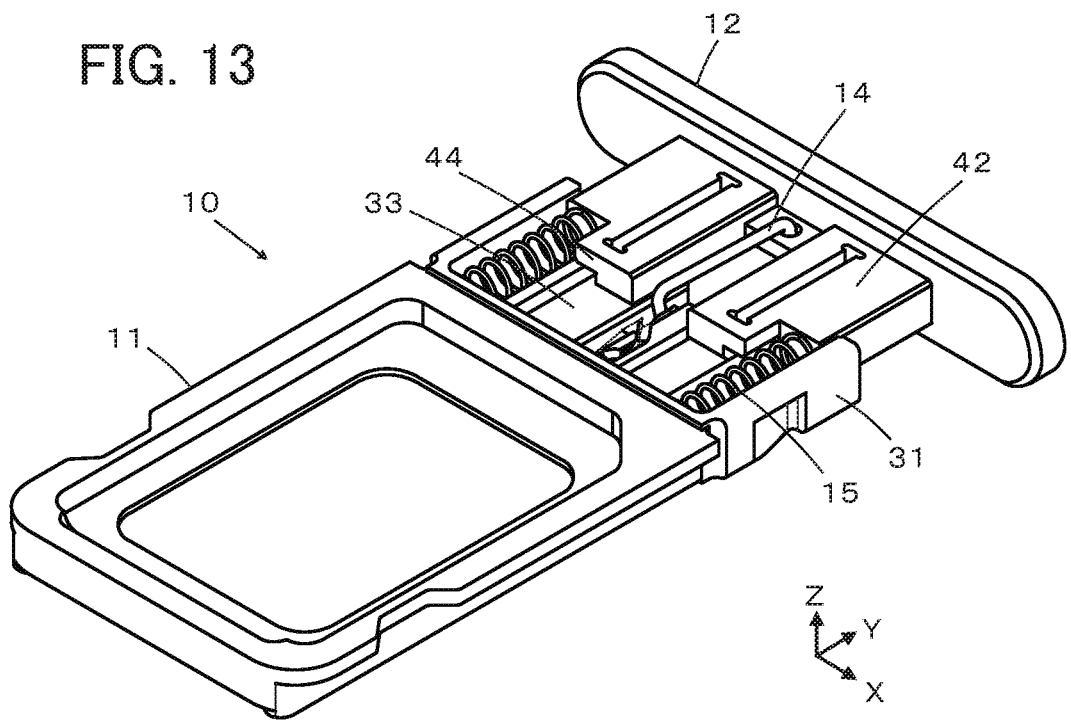
FIG. 13 is a perspective view of the connector tray according to Embodiment where the connection cover is not illustrated.

Now, a perspective view of the connector tray 10 is shown in FIG. 13 where the connection cover 13 is not illustrated. In the connector tray 10, the tray body 11 and the tray exterior portion 12 are interconnected, and the pair of guide portions 33 formed in the tray body-side connection portion 31 of the tray body 11 and the pair of guided portions 44 formed in the tray exterior portion-side connection portion 42 of the tray exterior portion 12 are in contact with each other.

Although not illustrated, the −Z directional end of the guided inner protrusion 44B of the guided portion 44 is in contact with the guide bottom 33A of the guide portion 33, and the guided inner protrusion 44B is disposed between the inner guide wall 33B and the outer guide wall 33C of the guide portion 33. The outer guide wall 33C of the guide portion 33 is received in the guided recess portion 44D of the guided portion 44, and the guided outer protrusion 44C of the guided portion 44 is received in the spring receiving groove 33D of the guide portion 33.

Since the pair of guide portions 33 of the tray body 11 and the pair of guided portions 44 of the tray exterior portion 12 are in contact with each other in this manner, the tray exterior portion 12 is displaceable in the Y direction with respect to the tray body 11, but the displacement in the X direction is restricted.

Figure 14:
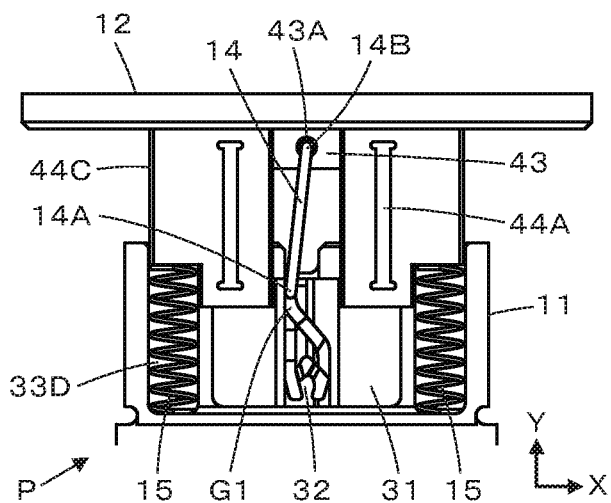
FIG. 14 is an enlarged plan view of the main part of FIG. 13.

As shown in FIG. 14, the second bending portion 14B formed at the +Y directional end of the cam follower 14 is inserted in the cam follower insertion hole 43A formed in the cam follower joint portion 43 of the tray exterior portion 12, and the first bending portion 14A formed at the −Y directional end of the cam follower 14 is inserted in the cam groove 32 formed in the tray body-side connection portion 31 of the tray body 11. The cam follower insertion hole 43A has a circular shape, and the second bending portion 14B of the cam follower 14 has a cylindrical shape; thus, the cam follower 14 is joined to the tray exterior portion 12 to be rotatable in an XY plane. Therefore, for instance, when the tray exterior portion 12 is displaced along the Y direction, the first bending portion 14A of the cam follower 14 can move along the cam groove 32 while drawing a circular trajectory having the center at the second bending portion 14B of the cam follower 14.

The two springs 15 are received separately in the spring receiving grooves 33D of the tray body 11, where the springs 15 are reduced in length compared to their equilibrium length. At this time, the +Y directional ends of the two springs 15 are in contact with the −Y directional ends of the guided outer protrusions 44C of the tray exterior portion 12. Thus, the springs 15 exert elastic forces on the tray exterior portion 12 in the +Y direction.

Turning now to FIG. 1, the connector cover 13 is attached to the connector tray 10 according to Embodiment, and this connector cover 13 restricts the displacement of the tray exterior portion 12 in the Z direction with respect to the tray body 11. Thus, the tray exterior portion 12 is allowed to be displaced only in the Y direction with respect to the tray body 11.

Figure 15:
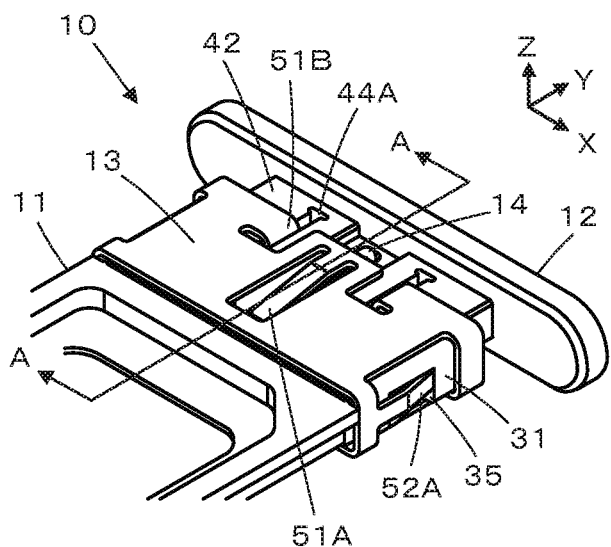
FIG. 15 is an enlarged perspective view of the main part of the connector tray according to Embodiment.

As shown in FIG. 15, the width of the upper wall bending portions 51B of the connection cover 13 in the Y direction is smaller than the length of the connection cover attachment grooves 44A formed in the tray exterior portion-side connection portion 42 of the tray exterior portion 12 in the Y direction, and the upper wall bending portions 51B are separately inserted in the connection cover attachment grooves 44A. In this state, the tray exterior portion 12 can be displaced in the Y direction with respect to the tray body 11; however, since the upper wall bending portions 51B are inserted in the connection cover attachment grooves 44A, the displacement of the tray exterior portion 12 in the Y direction is restricted within the range between the position where the upper wall bending portions 51B make contact with the −Y directional ends of the connection cover attachment grooves 44A and the position where the upper wall bending portions 51B make contact with the +Y directional ends of the connection cover attachment grooves 44A.

Figure 16:
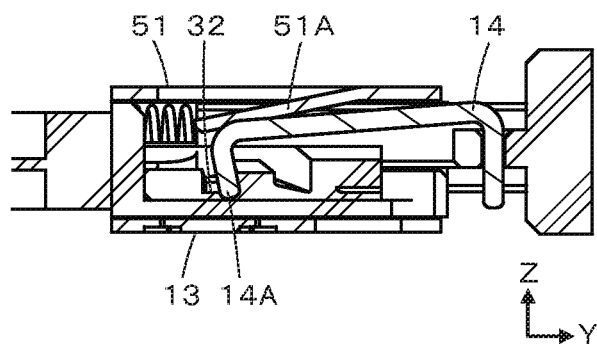
FIG. 16 is a cross-sectional view taken along line A-A in FIG. 15.

The lateral wall plate springs 52A of the connection cover 13 are inserted separately in the connection cover attachment recess portions 35 formed in the tray body-side connection portion 31 of the tray body 11. With this, the position of the connection cover 13 is fixed with respect to the tray body 11. FIG. 16 shows a cross-sectional view taken along line A-A cutting the connector tray 10 along a YZ plane so as to pass through the upper wall plate spring 51A of the connection cover 13 and the cam follower 14 in FIG. 15. The upper wall plate spring 51A formed in the connection cover upper wall 51 of the connection cover 13 makes contact with the cam follower 14 and exerts an elastic force in the −Z direction on the first bending portion 14A formed at the −Y directional end of the cam follower 14. Thus, the first bending portion 14A of the cam follower 14 can move along the cam groove 32 without floating in the +Z direction.

Turning now to FIG. 14, the cam groove 32 and the cam follower 14 constitute a so-called cam mechanism, and the two springs 15 constitute a push-out mechanism for pushing the tray exterior portion 12 out of the tray body 11 along the Y direction. The push-push mechanism P disposed between the tray body 11 and the tray exterior portion 12 has the cam mechanism and the push-out mechanism and is thus capable of displacing the tray exterior portion 12 in the Y direction between the first position away from the tray body 11 and the second position close to the tray body 11. The operation of the connector tray 10 according to Embodiment in connection with the push-push mechanism P is described below.

First, it is assumed that as shown in FIG. 14, the tray exterior portion 12 is in the first position away from the tray body 11 and the first bending portion 14A formed at the −Y directional end of the cam follower 14 is situated at the point G1 of the cam groove 32. At this time, while the tray exterior portion 12 is pushed toward the +Y direction by the two springs 15, the −Y directional ends of the upper wall bending portions 51B of the connection cover 13 (not shown) abut the −Y directional ends of the connection cover attachment grooves 44A of the tray exterior portion 12, and thus, the tray exterior portion 12 is maintained in the first position.

Figure 17:
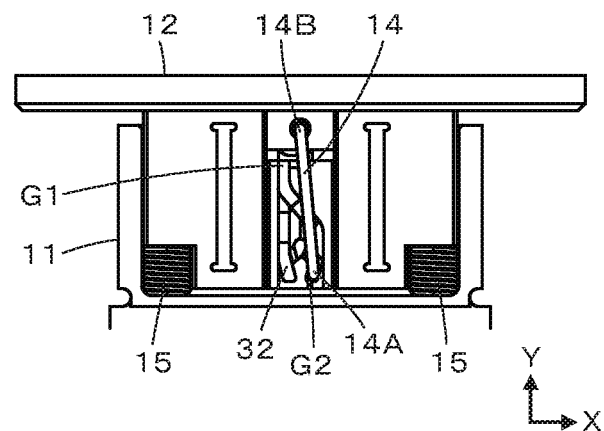
FIG. 17 is a view showing the tray exterior portion pushed toward the tray body from a first position in Embodiment.

With the tray exterior portion 12 being in the first position, when the tray exterior portion 12 is pushed toward the −Y direction with respect to the tray body 11 with a user's finger or the like, the first bending portion 14A of the cam follower 14 moves along the cam groove 32 as shown in FIG. 17.

After the tray exterior portion 12 is pushed toward the −Y direction with respect to the tray body 11 up to the position close to the tray body 11 to the limit, when the user's finger or the like pushing the tray exterior portion 12 toward the −Y direction is released from the tray exterior portion 12, the tray exterior portion 12 is pushed toward the +Y direction by the two springs and displaced in the +Y direction with respect to the tray body 11.

Figure 18:
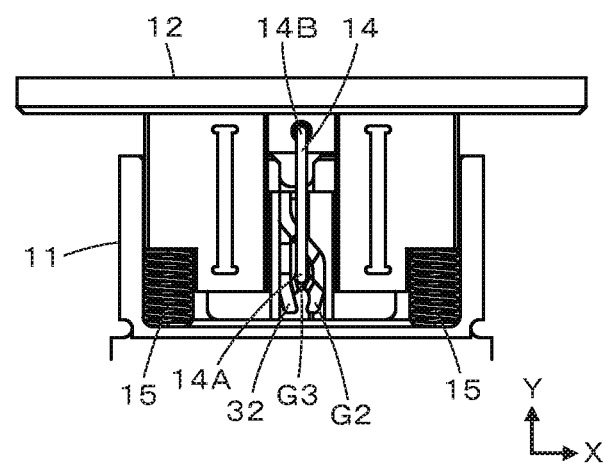
FIG. 18 is a view showing the tray exterior portion placed in a second position in Embodiment.

Meanwhile, in the state where the tray exterior portion 12 is in the position close to the tray body 11 to the limit, the first bending portion 14A of the cam follower 14 is situated at the point G2 of the cam groove 32, and when the user's finger or the like is released from the tray exterior portion 12 so that the tray exterior portion 12 is displaced in the +Y direction, as shown in FIG. 18, the first bending portion 14A of the cam follower 14 moves to the point G3 of the cam groove 32 and the tray exterior portion 12 moves to the second position. At this time, since the first bending portion 14A of the cam follower 14 catches on the lateral wall of the cam groove 32 on the +Y direction side at the point G3 of the cam groove 32, the tray exterior portion 12 is maintained in the second position.

Since the cam groove 32 is provided with the steps, the first bending portion 14A of the cam follower 14 is allowed to move only clockwise along the cam groove 32 when the cam groove 32 is viewed from the +Z direction side. Therefore, when the user's finger or the like is released from the tray exterior portion 12 with the first bending portion 14A of the cam follower 14 being situated at the point G2 of the cam groove 32, the first bending portion 14A of the cam follower 14 is prevented from moving counterclockwise and returning to the end point G1, and hence, the first bending portion 14A moves to the point G3.

Figure 19:
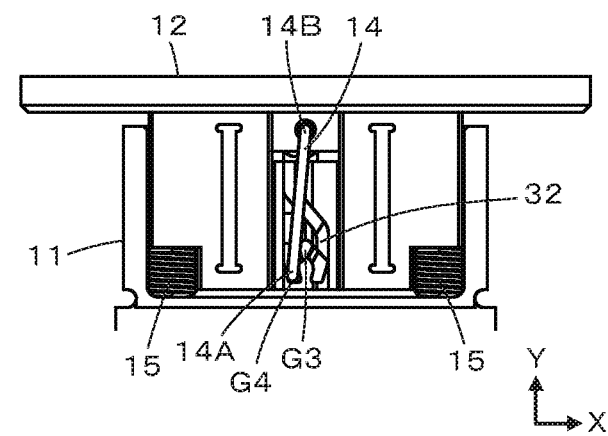
FIG. 19 is a view showing the tray exterior portion further pushed toward the tray body from the second position in Embodiment.

With the tray exterior portion 12 being in the second position with respect to the tray body 11, when the tray exterior portion 12 is again pushed toward the −Y direction with respect to the tray body 11, the first bending portion 14A of the cam follower 14 moves from the point G3 to the point G4 along the cam groove 32 as shown in FIG. 19. In this state, when the user's finger or the like pushing the tray exterior portion 12 toward the −Y direction is released from the tray exterior portion 12, the tray exterior portion 12 is pushed out toward the +Y direction by the two springs 15. Consequently, the first bending portion 14A of the cam follower 14 moves to the end point G1 of the cam groove 32, and the tray exterior portion 12 is again placed to the first position as shown in FIG. 14.

Thus, the push-push mechanism P disposed between the tray body 11 and the tray exterior portion 12 allows the tray exterior portion 12 to be displaced in the Y direction between the first position away from the tray body 11 and the second position close to the tray body 11.

Figure 20:
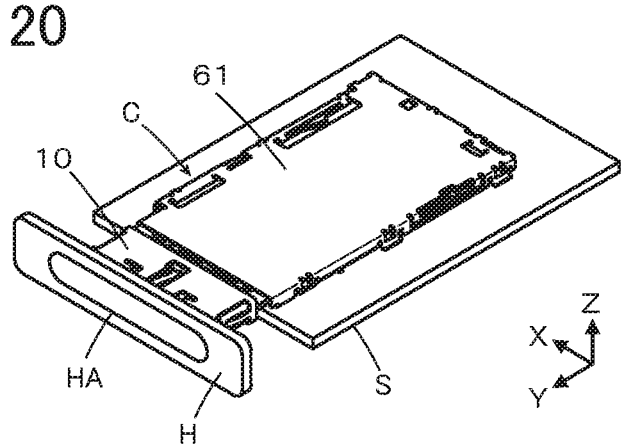
FIG. 20 is a view showing a connector having the connector tray according to Embodiment.
Figure 21:
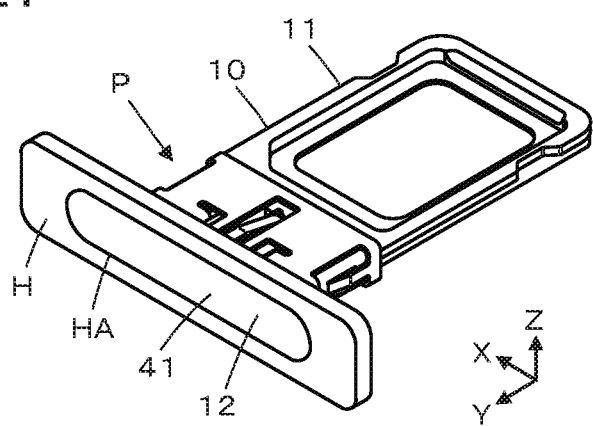
FIG. 21 is a view showing the tray body inserted in a housing and the tray exterior portion placed in the second position in Embodiment.

When used, the connector tray 10 according to Embodiment described above is, while accommodating a connection object such as a SIM card (not shown) in the tray body 11, inserted in a connector body 61 mounted on a substrate S in a housing H, as shown in FIG. 20. The connector tray 10 and the connector body 61 as above constitute a connector C. In the connector C, upon the insertion of the connector tray 10 into the connector body 61 disposed in the housing H, a connection terminal (not shown) of the connection object accommodated in the connector tray 10 and a connection terminal (not shown) of the connector body 61 are brought into contact with each other, whereby the connection object and the connector body 61 are electrically connected to each other. In the example shown in FIG. 20, the housing H is provided with a tray insertion hole HA through which the connector tray 10 is inserted, and the connector tray 10 is inserted into the connector body 61 in the housing H through the tray insertion hole HA. At this time, as shown in FIG. 21, the tray exterior portion 12 is in the second position close to the tray body 11, and the +Y directional end of the grip portion 41 of the tray exterior portion 12 is situated in the almost same position in the Y direction as the +Y directional end of the housing H.

Figure 22:
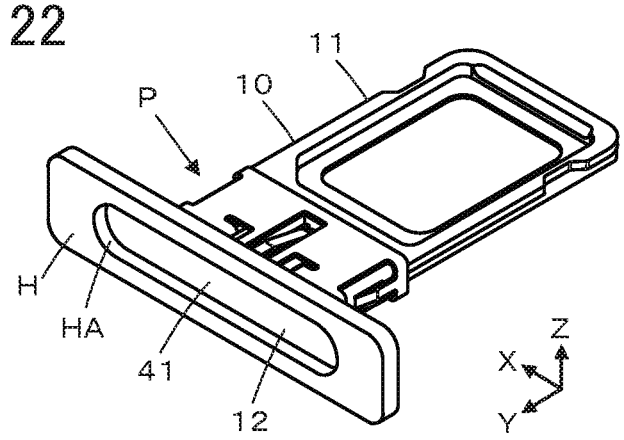
FIG. 22 is a view showing the tray body inserted in the housing and the tray exterior portion pushed toward the tray body from the second position in Embodiment.
Figure 23:
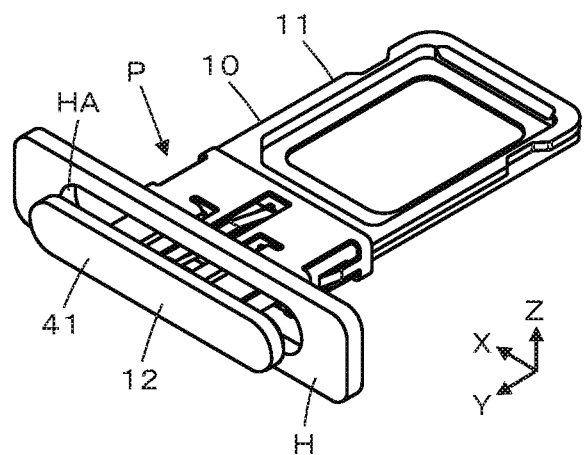
FIG. 23 is a view showing the tray body inserted in the housing and the tray exterior portion ejected from the housing in Embodiment.

In the state where the tray exterior portion 12 is in the second position with respect to the tray body 11 as above, when the grip portion 41 of the tray exterior portion 12 is pushed toward the −Y direction with a user's finger or the like as shown in FIG. 22, the tray exterior portion 12 is pushed out of the tray body 11 due to the push-push mechanism P. Consequently, the tray exterior portion 12 is placed to the first position with respect to the tray body 11 as shown in FIG. 23. In this process, while the tray body 11 remains inserted in the housing H without change in position, the tray exterior portion 12 is displaced in the +Y direction. As a result, the grip portion 41 of the tray exterior portion 12 is pushed out of the housing H. For instance, the user can easily take out the connector tray 10 from the housing H by pulling in the +Y direction the grip portion 41 of the tray exterior portion 12 that is situated outside the housing H.

Figure 24:
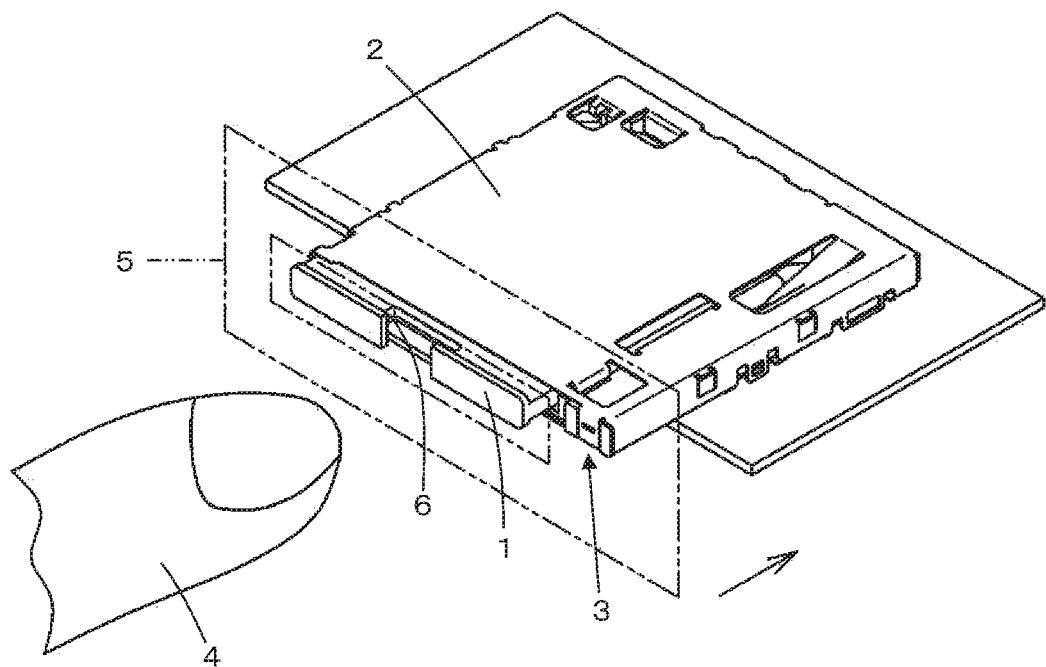
FIG. 24 is a view showing a conventional connector.

In the meantime, as a connector for connection objects such as SIM cards, the connector as shown in FIG. 24 has been conventionally developed. The conventional connector shown in FIG. 24 includes the card holder 1 for holding a connection object (not shown) and the connector body 2 disposed inside the housing 5 to receive the card holder 1. The connector body 2 has therein the push-push mechanism 3 that is situated in parallel to the card holder 1 with respect to the insertion direction when the card holder 1 is inserted in the connector body 2.

The connector configured as above is designed such that upon being pushed toward the connector body 2, the card holder 1 is pushed out of the housing 5 due to the push-push mechanism 3; however, when a contact force between the card holder 1 and the connector body 2 exceeds a force of the push-push mechanism 3 pushing out the card holder 1 for any reason, this may hamper the ejection of the card holder 1 from the housing 5 as also described in JP 2015-11954 A. To cope with it, as shown in FIG. 24, the card holder 1 is provided with the recess portion 6 for catching a pin-shaped tool for example, and it is sometimes necessary to forcibly pull out the card holder 1 from the connector body 2 using the pin-shaped tool.

In the connector tray 10 according to Embodiment, owing to the push-push mechanism P disposed between the tray body 11 and the tray exterior portion 12 in a tandem arrangement, the tray exterior portion 12 is displaceable in the Y direction between the first position away from the tray body 11 and the second position close to the tray body 11; therefore, even when a contact force between a connection object (not shown) accommodated in the connector tray 10 and the connector body 61 and a contact force between the connector tray 10 and the connector body 61 are large, the push-push mechanism P makes it possible to smoothly eject the tray exterior portion 12 from the housing H regardless of the magnitude of the contact forces. Thus, the connector tray 10 according to Embodiment makes it possible to prevent the situation where the connector tray 10 needs to be forcibly pulled out of the connector body 61 using a pin-shaped tool or another tool as in the conventional connector, and thus, a connection object can be smoothly taken out of the connector body 61.

What is claimed is:

1. A connector tray inserted into a connector body in an insertion direction while accommodating an object to be connected, the connector tray comprising:

a tray body configured to accommodate the object to be connected;

a tray exterior portion connected to the tray body to be displaceable along the insertion direction; and a push-push mechanism disposed between the tray body and the tray exterior portion in a tandem arrangement and configured to displace the tray exterior portion in the insertion direction between a first position away from the tray body and a second position close to the tray body, the push-push mechanism includes:

a cam mechanism connected to the tray exterior portion; and a push-out mechanism arranged in parallel to the cam mechanism in the insertion direction and configured to push out the tray exterior portion in the insertion direction with respect to the tray body, wherein the push-out mechanism includes two springs disposed on opposite sides with respect to the cam mechanism in a width direction perpendicular to the insertion direction, wherein the tray body has a pair of guide portions that are situated separately on the opposite sides with respect to the cam mechanism in the width direction and extend along the insertion direction, wherein the tray exterior portion has a pair of guided portions contacting the pair of guide portions, wherein each of the pair of guide portions has a guide bottom which is to be in contact with one of the guided portions, and a spring receiving groove for receiving the one of the two springs, wherein the spring receiving groove has a spring receiving groove bottom formed at a position lower than the guide bottom in a height direction perpendicular to the insertion direction and the width direction.

2. The connector tray according to claim 1, wherein the cam mechanism includes: a cam groove formed in the tray body; and a cam follower having one end inserted in the cam groove and an other end joined to the tray exterior portion, and wherein the other end of the cam follower is rotatably joined to the tray exterior portion, and the one end of the cam follower moves along the cam groove.

3. The connector tray according to claim 1, wherein when the tray exterior portion is displaced in the insertion direction with respect to the tray body, a displacement of the guided portion in a direction perpendicular to the insertion direction is restricted by the guide portion.

4. The connector tray according to claim 1, wherein the tray body accommodates the object to be connected that is in a card shape.

5. A connector in which the connector tray according to claim 1 is inserted in the connector body.

* * * * *